United States Patent
Semenyshev et al.

(10) Patent No.: US 9,300,274 B2
(45) Date of Patent: Mar. 29, 2016

(54) METHOD OF PROVIDING MULTIPLE VOLTAGE REFERENCES TO A RADIO-FREQUENCY DEVICE USING A SINGLE ANALOG LINE

(71) Applicant: ZTE Corporation, Shenzhen (CN)

(72) Inventors: Aleksandr Semenyshev, Apex, NC (US); Shawn Walsh, Cary, NC (US); Ying Shen, Chapel Hill, NC (US); Thanh Hung Nguyen, Cary, NC (US); Hong Hu, Xian (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 14/579,890

(22) Filed: Dec. 22, 2014

(65) Prior Publication Data

US 2015/0137878 A1 May 21, 2015

Related U.S. Application Data

(62) Division of application No. 14/161,610, filed on Jan. 22, 2014, now Pat. No. 9,013,227.

(60) Provisional application No. 61/755,382, filed on Jan. 22, 2013.

(51) Int. Cl.
  *H03K 3/01* (2006.01)
  *G06F 13/00* (2006.01)
  *H03D 7/12* (2006.01)

(52) U.S. Cl.
  CPC *H03K 3/01* (2013.01); *G06F 13/00* (2013.01); *H03D 7/12* (2013.01)

(58) Field of Classification Search
  CPC ............. H03K 3/01; G06F 13/00; H03D 7/12
  See application file for complete search history.

(56) References Cited

U.S. PATENT DOCUMENTS

| 7,321,751 B2 * | 1/2008 | Sorrells | H03C 3/40 327/113 |
|---|---|---|---|
| 7,944,314 B2 * | 5/2011 | Zhu | H03K 5/1565 315/307 |
| 8,571,512 B2 * | 10/2013 | Rafi | H03D 7/12 455/130 |
| 8,878,570 B2 | 11/2014 | Thomsen | |
| 2008/0174362 A1 | 7/2008 | Ishizuka et al. | |
| 2009/0326624 A1 | 12/2009 | Melse | |
| 2013/0076549 A1 | 3/2013 | Bajdechi et al. | |
| 2015/0048868 A1 * | 2/2015 | Zhao | H03B 23/00 327/113 |
| 2015/0194949 A1 * | 7/2015 | McQuirk | H03K 3/011 327/291 |

* cited by examiner

*Primary Examiner* — Jung Kim
(74) *Attorney, Agent, or Firm* — Morgan, Lewis & Bockius LLP

(57) ABSTRACT

A method of providing multiple voltage references to a radio-frequency device using a single analog line includes the steps of setting the analog line voltage level to be a first reference voltage signal; instructing a first voltage reference device to memorize the first reference voltage signal by sending a first digital control signal to a digital line; providing the first reference voltage signal to the RF device via the first voltage reference device; re-setting the analog line voltage level to be a second reference voltage signal; instructing a second voltage reference device to memorize the second reference voltage signal by sending a second digital control signal to the digital line, the second digital control signal being different from the first digital control signal; and providing the second reference voltage signal to the RF device via the second voltage reference device.

8 Claims, 4 Drawing Sheets

US 9,300,274 B2

METHOD OF PROVIDING MULTIPLE VOLTAGE REFERENCES TO A RADIO-FREQUENCY DEVICE USING A SINGLE ANALOG LINE

RELATED APPLICATION

The present application is a divisional application of U.S. patent application Ser. No. 14/161,610, entitled "SYSTEM OF PROVIDING MULTIPLE VOLTAGE REFERENCES TO A RADIO-FREQUENCY DEVICE USING A SINGLE ANALOG LINE" filed Jan. 22, 2014, which claims priority to U.S. Provisional Application No. 61/755,382, "A SYSTEM OF MULTIPLE VOLTAGE REFERENCES USING A SINGLE ANALOG LINE," filed Jan. 22, 2013, both of which are hereby incorporated by reference in their entirety.

TECHNICAL FIELD

The present application relates to wireless communication system and wireless communication radio frequency (RF) equipment, and in particular, relates to a system of providing multiple voltage references to a RF device using a single analog line.

BACKGROUND

Modern RF devices, such as mixers, upconverters, downconverters, power amplifiers and the latest highly integrated multifunction ICs, often require operation mode tuning using multiple independent voltage references (VREF). In some circumstances, the reference voltages need to be re-adjusted at runtime for various operation environments such as temperature, frequency, power level, etc. Such devices are usually calibrated during product manufacturing, for example, individually calibrated for each manufactured unit, and the values of the reference voltages are stored inside the on-board electrically erasable programmable read-only memory (EEPROM).

A most common approach to provide multiple reference voltages to the controlled device is illustrated in FIG. 1, where a digital-to-analog converter (DAC) with multiple channels is used.

In a modular design approach, a CPU/MPU with a DAC are disposed on one board referred as the "control board", while the controlled device, such as mixers, upconverters, etc., are disposed on a different board referred as the "controlled board". The physical interface between the control board and the controlled board is predefined so that the same type of the control board can be connected to different predefined types of the controlled board. FIG. 2 depicts a structure of a revised system to provide reference voltage to a mixer on a controlled board.

However, a connector of the control board has a limited and fixed number of analog lines determined by the original design of the controlled board. Future revisions or new types of the controlled board may require more reference voltages than originally designed. Therefore, the interface of a current controlled board may not be able to provide enough analog lines to meet the new design requirements. FIG. 3 depicts a compatibility problem of the revised system to provide reference voltage to a mixer on a controlled board. Note that the mixer needs two reference voltage signals but the control board can only provide one.

SUMMARY

The present application provides a cost effective method to provide two different reference voltages from the control device using a single analog line, a single digital line, and two erasable programmable read-only memory (EEPROM) disposed on the controlled board.

In accordance with some embodiments, a system of providing multiple voltage references to a radio-frequency device using a single analog line includes a control board, a controlled board, and a connector connecting the control board to the controlled board. The control board includes: a processing unit that configures the reference voltage signals; a non-volatile memory that stores information about the reference voltage signals; and a digital-to-analog converter (DAC) that outputs the reference voltage signals in accordance with instructions from the processing unit. The controlled board includes: a first voltage reference device that receives a first reference voltage signal; a second voltage reference device that receives a second reference voltage signal; and a RF device that receives a first frequency signal and a second frequency signal, and outputs a third frequency signal based on one of the first and second reference voltage signals. The connector includes an analog line reference voltage signals to the first and second voltage reference devices and a digital line for providing control signals to the first and second voltage reference devices.

In accordance with some embodiments, a method of providing multiple voltage references to a radio-frequency device using a single analog line includes the steps of setting the analog line voltage level to be a first reference voltage signal; instructing a first voltage reference device to memorize the first reference voltage signal by sending a first digital control signal to a digital line; providing the first reference voltage signal to the RF device via the first voltage reference device; re-setting the analog line voltage level to be a second reference voltage signal; instructing a second voltage reference device to memorize the second reference voltage signal by sending a second digital control signal to the digital line, wherein the second digital control signal is different from the first digital control signal; and providing the second reference voltage signal to the RF device via the second voltage reference device. The RF device is configured to receive a first frequency signal and a second frequency signal, and output a third frequency signal based on one of the first and second reference voltage signals.

BRIEF DESCRIPTION OF THE DRAWINGS

Different aspects of the present application as well as features and advantages thereof will be more clearly understood hereinafter because of a detailed description of embodiments of the present application when taken in conjunction with the accompanying drawings, which are not necessarily drawn to scale. Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present application and the subject matter may be practiced without these specific details. For example, it will be apparent to one of ordinary skill in the art that the subject matter presented herein can be implemented on many types of outdoor radios systems.

Figure 1:
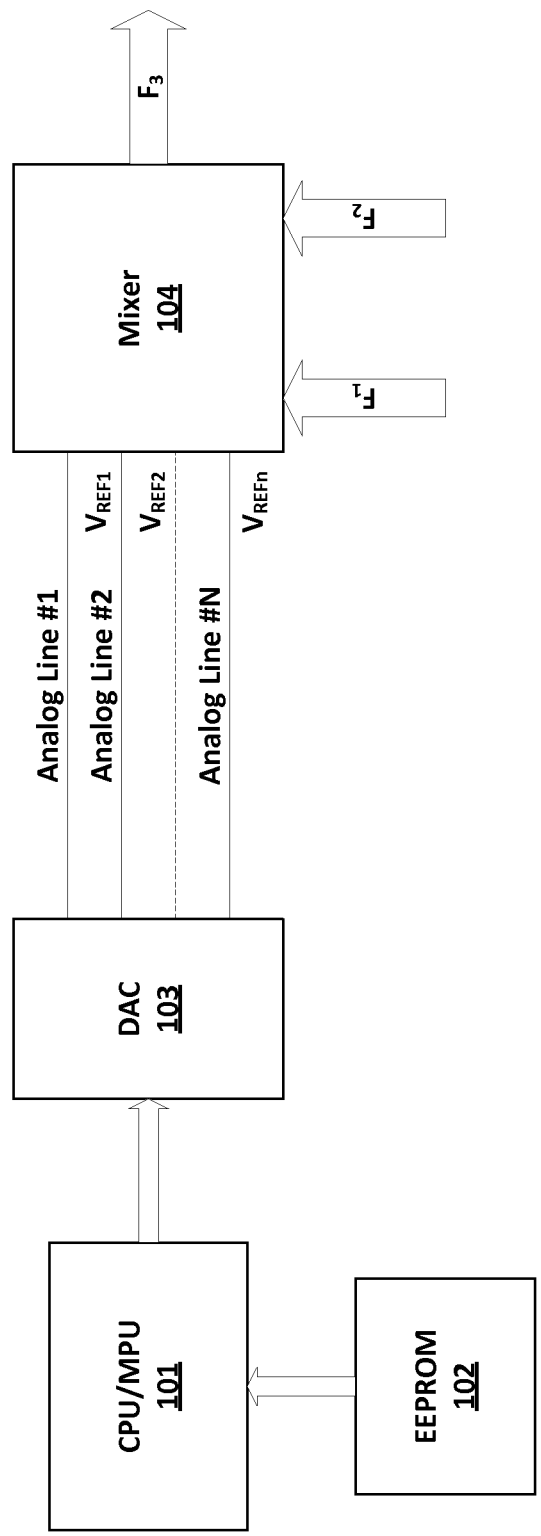
FIG. 1 depicts a structure of a conventional system to provide N reference voltages to a mixer.

FIG. 1 depicts a structure of a conventional system to provide N reference voltages to a mixer. The system includes a CPU/MPU 101, an EEPROM 102, a DAC 103 with N multiple analog lines, and a mixer 104. The CPU/MPU 101 configures the voltage for each of the DAC 103 outputs using data stored in the EEPROM 102. Further, the DAC 103 is configured to provide the reference voltage, for example, $V_{REF1}$ to the mixer 104 through one of the analog lines. The mixer 104 receives a first frequency signal $F_1$ and a second frequency signal $F_2$, and generates a third frequency signal $F_3$ based on the reference voltage $V_{REF1}$.

Figure 2:
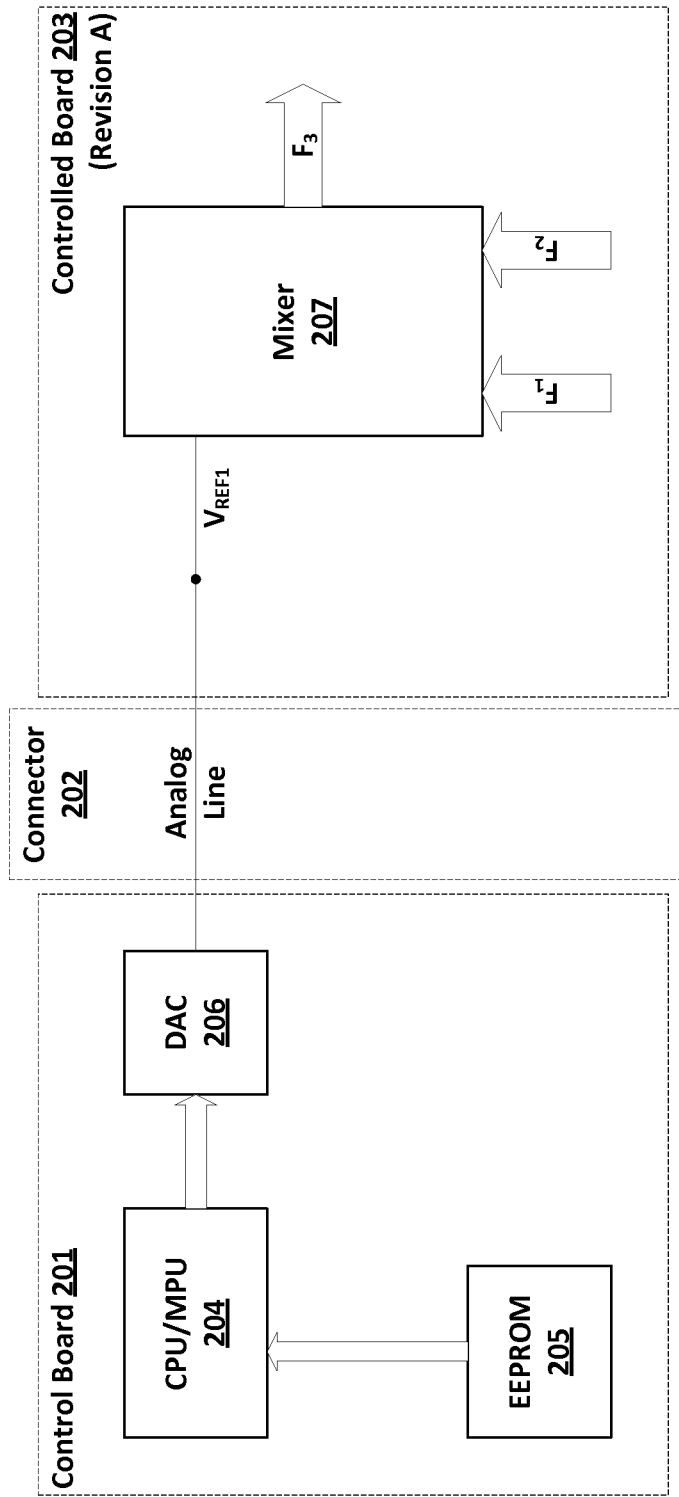
FIG. 2 depicts a structure of a revised system to provide reference voltage to a mixer on a controlled board.

FIG. 2 depicts a structure of a revised system to provide a reference voltage to a mixer on a controlled board. The revised system includes a control board 201, a controlled board 203, and a connector 202 to connect the control board 201 to the controlled board 203. A CPU/MPU 204, an EEPROM 205, and a DAC 206 are disposed on the control board 201, and a mixer 207 is disposed on the controlled board 203. The DAC 206 provides a reference voltage $V_{REF1}$ to the mixer 207 via an analog line. The mixer 207 receives a first frequency signal $F_1$ and a second frequency signal $F_2$, and generates a third frequency signal $F_3$ based on the reference voltage $V_{REF1}$.

Figure 3:
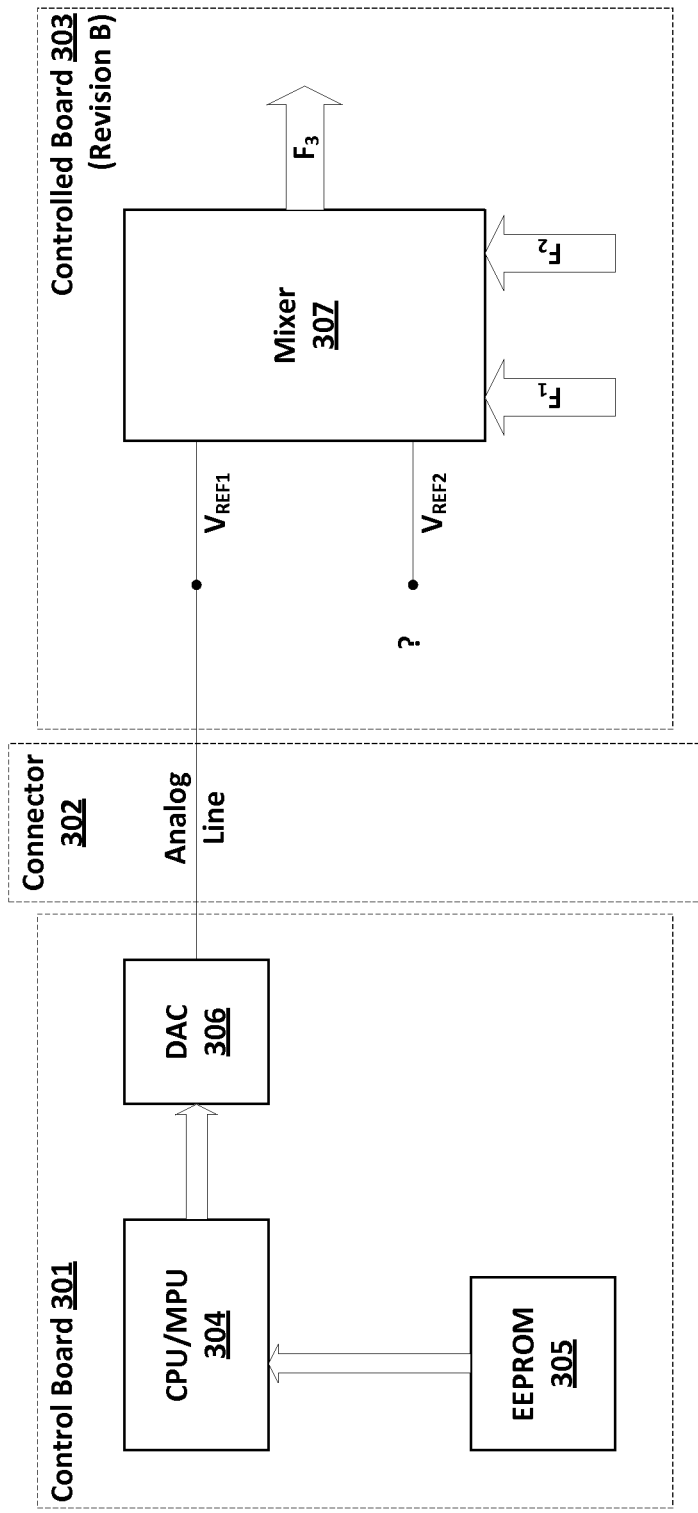
FIG. 3 depicts a compatibility problem of the revised system to provide reference voltage to a mixer on a controlled board.

FIG. 3 depicts a compatibility problem of the revised system to provide reference voltage to a mixer on a controlled board. The connector 302 connecting the control board 301 and the controlled board 302 has a limited number of the analog lines determined by the original design of the controlled board 303. As illustrated in FIG. 3, the control board 301 cannot provide a second reference voltage $V_{REF2}$ to the mixer 307 due to the limited number of the analog lines at the physical interface of the controlled board 303.

Figure 4:
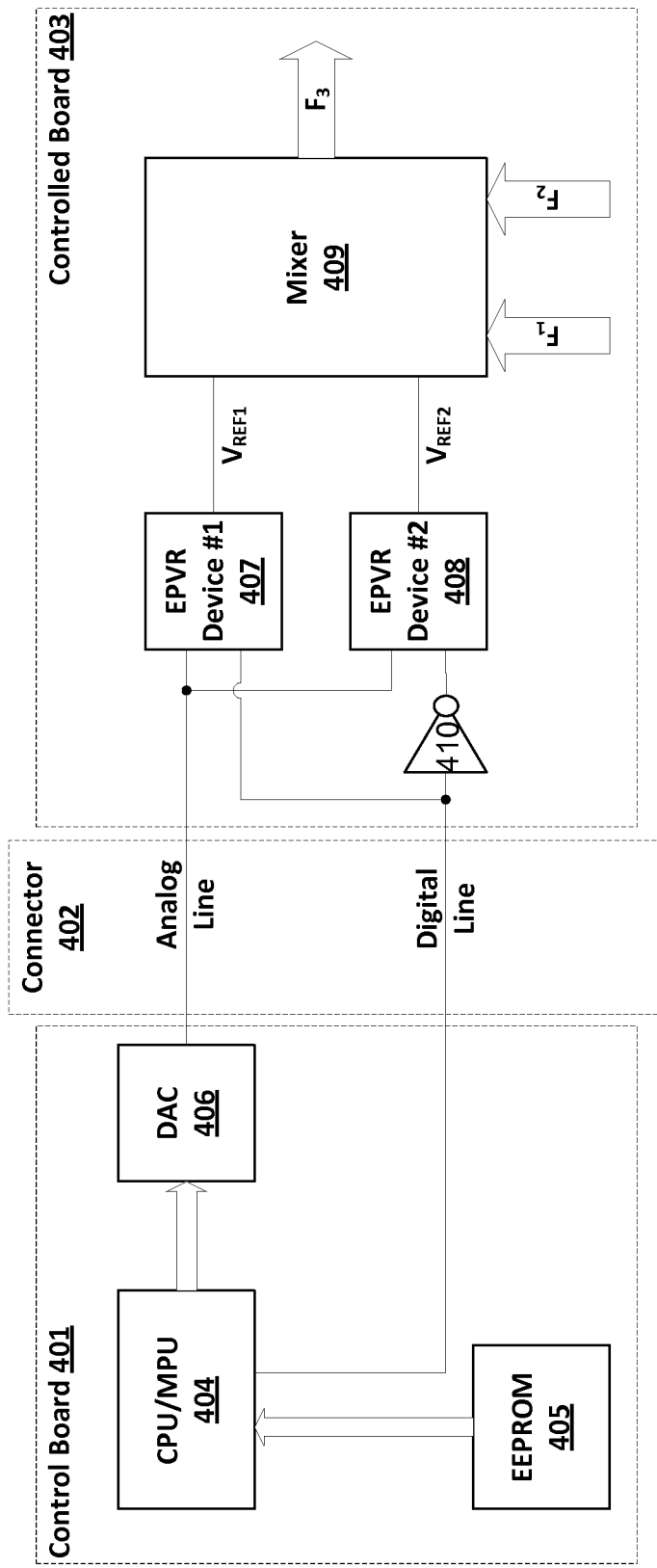
FIG. 4 depicts a structure of a system of providing multiple voltage references to a mixer using a single analog line in accordance with some embodiments of the present application.

FIG. 4 depicts a structure of a system of providing multiple voltage references to a mixer using a single analog line in accordance with some embodiments of the present application. The system includes a control board 401, a controlled board 403, and a connector 402 that connects the control board 401 to the controlled board 403. A CPU/MPU 404, an EEPROM 405, and a DAC 406 are disposed on the control board 401, and a first voltage reference device (EPVR device #1) 407, a second voltage reference device (EPVR device #2) 408, and a mixer 409 are disposed on the controlled board 403. As shown in FIG. 4, the DAC 406 provides reference voltages to the first voltage reference device 407 and the second voltage reference device 408 via a single analog line. The first voltage reference device 407 and the second voltage reference device 408 are configured to provide a first reference voltage signal $V_{REF1}$ and a second reference voltage signal $V_{REF2}$ to the mixer 409, respectively. Note that there is an inverter 410 before the second voltage reference device 408. The mixer 409 receives a first frequency signal $F_1$ and a second frequency signal $F_2$, and generates a third frequency signal $F_3$ based on the first reference voltage signal $V_{REF1}$ and the second reference voltage signal $V_{REF2}$.

In some embodiments, the voltage reference device is an electronically programmable voltage reference device (EPVR). The EPVR is an integrated circuit (IC) that can read and memorize the level of the input analog signal, and provide a memorized level of signal on the analog output even when the voltage level of the input analog signal changes, or after the input analog signal is removed.

In some embodiments, the analog line within the connector 402 and between the control board 401 and the controlled board 403 is only used during a short time period for the reference voltages configuration. The voltage level at the analog line is initially set to be the first reference voltage signal $V_{REF1}$. Once the voltage level at the analog line is initially set, the CPU/MPU 404 sends a first digital control signal to the first voltage reference device (EPVR device #1) 407 through the digital line within the connector 402 to memorize the initially set voltage level, and to provide the first reference voltage signal $V_{REF1}$ to the mixer 409. In some embodiments, after the first reference voltage signal $V_{REF1}$ is configured, the voltage level at the analog line is changed to the second reference voltage signal $V_{REF2}$. By resetting the digital line to its original state, the CPU/MPU 404 sends a second digital control signal to the second voltage reference device (EPVR device #2) 408 through the digital line within the connector 402 to memorize the newly set voltage level, and to provide the second reference voltage signal $V_{REF2}$ to the mixer 409. In this example, the second digital control signal is different from (e.g., opposite to) the first digital control signal. After both the first reference voltage signal $V_{REF1}$ and the second reference voltage signal $V_{REF2}$ are configured, the DAC 406 at the control board 401 can be shutdown to preserve power. The digital line will remain in its current state until the next reconfiguration of the reference voltage.

In some embodiments, when at least two digital lines are available between the control board and the controlled board, one more DACs may be directly disposed on the controlled board, which will be programmable via an inter-integrated circuit ($I^2$ C) interface.

The key advantages of this invention include:
Multiple reference voltages configuration using a single analog line.
Reduced power consumption of the control board.
Ability to reconfigure reference voltage at any moment.
Easy reference voltage configuration process.

While particular embodiments are described above, it will be understood it is not intended to limit the invention to these particular embodiments. On the contrary, the invention includes alternatives, modifications and equivalents that are within the spirit and scope of the appended claims. Numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the embodiments.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Although some of the various drawings illustrate a number of logical stages in a particular order, stages that are not order dependent may be reordered and other stages may be combined or broken out. While some reordering or other groupings are specifically mentioned, others will be obvious to those of ordinary skill in the art and so do not present an exhaustive list of alternatives. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

We claim:

1. A method of providing multiple voltage references to a radio frequency (RF) device using a single analog line, comprising:

setting the analog line voltage level to be a first reference voltage signal;

instructing a first voltage reference device to memorize the first reference voltage signal by sending a first digital control signal to a digital line;

providing the first reference voltage signal to the RF device via the first voltage reference device;

re-setting the analog line voltage level to be a second reference voltage signal;

instructing a second voltage reference device to memorize the second reference voltage signal by sending a second digital control signal to the digital line, wherein the second digital control signal is different from the first digital control signal; and providing the second reference voltage signal to the RF device via the second voltage reference device, wherein the RF device is configured to receive a first frequency signal and a second frequency signal, and output a third frequency signal based on one of the first and second reference voltage signals.

2. The method of claim 1, wherein the first reference voltage signal and the second reference voltage signal are generated by a control board, the control board further including:

a processing unit that configures the first and second reference voltage signals;

a non-volatile memory that stores information about the first and second reference voltage signals; and a digital-to-analog converter (DAC) that outputs the first and second reference voltage signals in accordance with instructions from the processing unit.

3. The method of claim 2, wherein the RF device is a component of a controlled board, the controlled board further including:

a first voltage reference device that receives the first reference voltage signal from the DAC; and a second voltage reference device that receives the second reference voltage signal from the DAC.

4. The method of claim 3, wherein the first voltage reference device and the second voltage reference device are electronically programmable voltage reference devices (EPVR).

5. The method of claim 3, wherein the analog line connects the DAC to the first voltage reference device and the second voltage reference device, respectively, and the digital line connects the processing unit to the first voltage reference device and the second voltage reference device, respectively.

6. The method of claim 5, wherein there is an inverter between the digital line and the second voltage reference device.

7. The method of claim 1, wherein the second digital control signal is different from the first digital control signal.

8. The method of claim 1, wherein the RF device is one selected from the group consisting of a mixer, an upconverter, a downconverter, a power amplifier and a highly integrated multifunction IC.

* * * * *